United States Patent [19]
Patterson et al.

[11] Patent Number: 6,064,156
[45] Date of Patent: May 16, 2000

[54] PROCESS FOR IGNITION OF GASEOUS ELECTRICAL DISCHARGE BETWEEN ELECTRODES OF A HOLLOW CATHODE ASSEMBLY

[75] Inventors: Michael J. Patterson, Brunswick; Timothy R. R. Verhey, Cleveland; George C. Soulas, North Ridgeville, all of Ohio

[73] Assignee: The United States of America as represented by the Administrator of NASA, Washington, D.C.

[21] Appl. No.: 09/152,407

[22] Filed: Sep. 14, 1998

[51] Int. Cl.$^7$ ............................... H01J 27/02; H05H 1/24
[52] U.S. Cl. ................ 315/111.91; 315/111.21; 60/202; 250/423 R
[58] Field of Search .................. 315/111.21, 111.81, 315/111.91; 250/423 R; 60/202

[56] References Cited

U.S. PATENT DOCUMENTS

| | | | |
|---|---|---|---|
| 3,944,873 | 3/1976 | Franks et al. | 315/111.81 |
| 4,049,989 | 9/1977 | Bullis et al. | 313/230 |
| 4,087,721 | 5/1978 | Mourier | 313/230 |
| 4,339,691 | 7/1982 | Moriyima et al. | 315/111.21 |
| 4,377,773 | 3/1983 | Hershcovitch et al. | 315/111.81 |
| 4,428,901 | 1/1984 | Bennett | 376/105 |
| 4,800,281 | 1/1989 | Williamson | 315/111.81 |
| 4,894,546 | 1/1990 | Fukui et al. | 250/423 R |
| 5,075,594 | 12/1991 | Schumacher et al. | 315/111.21 |
| 5,241,243 | 8/1993 | Cirri | 315/111.21 |
| 5,352,954 | 10/1994 | Cirri | 315/111.21 |
| 5,569,976 | 10/1996 | Gavrilov | 313/359.1 |
| 5,581,155 | 12/1996 | Morozov et al. | 315/111.21 |

*Primary Examiner*—Justin P. Bettendorf
*Attorney, Agent, or Firm*—Kent N. Stone

[57] ABSTRACT

The design and manufacturing processes for Hollow Cathode Assemblies (HCA's) that operate over a broad range of emission currents up to 30 Amperes, at low potentials, with lifetimes in excess of 17,500 hours. The processes include contamination control procedures which cover hollow cathode component cleaning procedures, gas feed system designs and specifications, and hollow cathode activation and operating procedures to thereby produce cathode assemblies that have demonstrated stable and repeatable operating conditions, for both the discharge current and voltage. The HCA of this invention provides lifetimes of greater than 10,000 hours, and expected lifetimes of greater than 17,500 hours, whereas the present state-of-the-art is less than 500 hours at emission currents in excess of 1 Ampere. Stable operation is provided over a large range of operating emission currents, up to a 6:1 ratio, and this HCA can emit electron currents of up to 30 Amperes in magnitude to an external anode that simulates the current drawn to a space plasma, at voltages of less than 20 Volts.

1 Claim, 9 Drawing Sheets

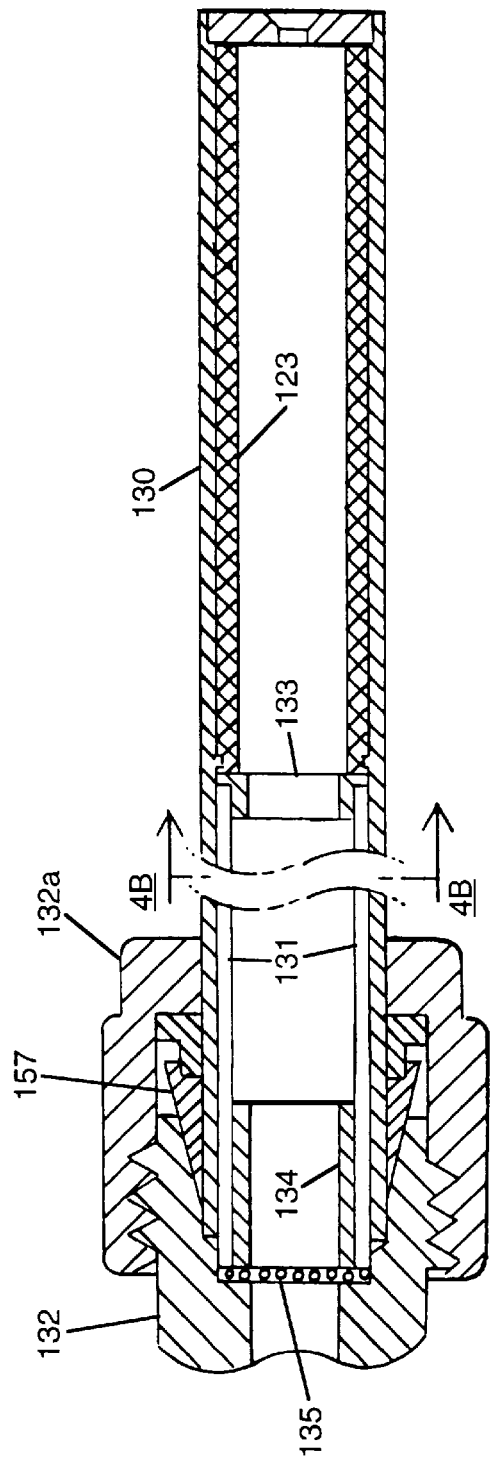
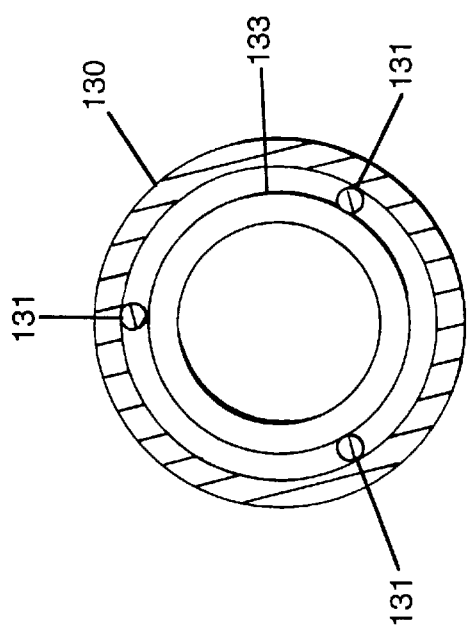
FIG. 4A
FIG. 4B

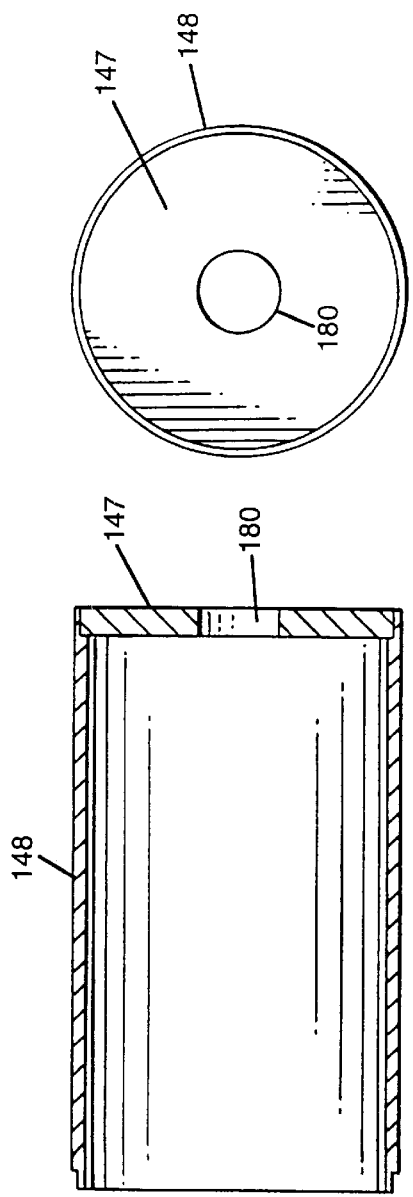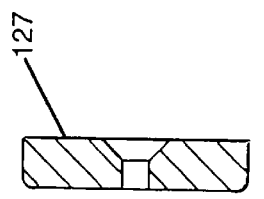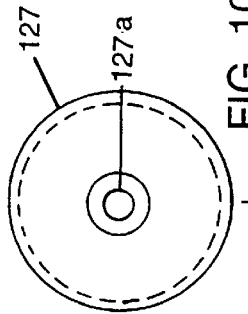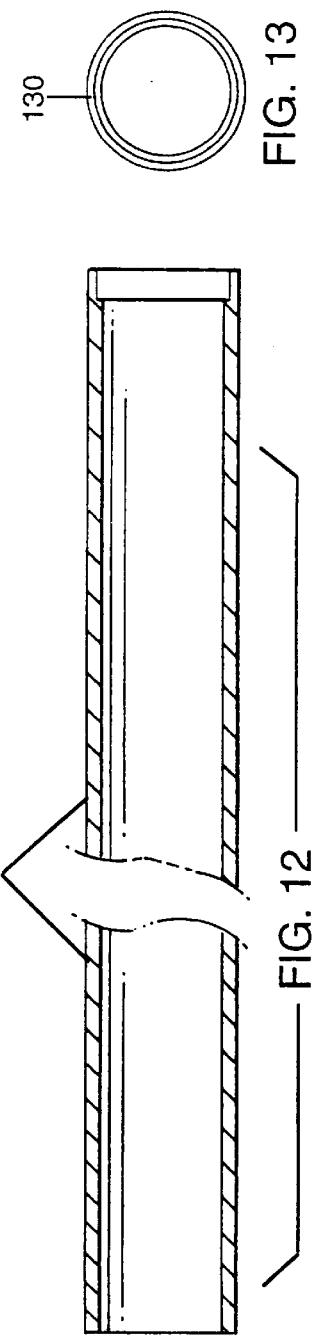

PROCESS FOR IGNITION OF GASEOUS ELECTRICAL DISCHARGE BETWEEN ELECTRODES OF A HOLLOW CATHODE ASSEMBLY

FIELD OF THE INVENTION

The present invention relates to a hollow cathode electron source, which finds application in plasma generation, and more particularly to a long-life hollow cathode plasma generator and to its design, manufacturing process and assembly. These manufacturing processes include contamination control procedures which cover hollow cathode component cleaning procedures, gas feed system designs and specifications, and hollow cathode activation and operating procedures.

BACKGROUND OF THE INVENTION

Cathodes emit electrons when elevated in temperature by a process known as thermionic emission. Thermionic emitters generally consist of a wire that is made of some refractory metal, which may be typically made of tungsten or molybdenum. The wire is then coated, or impregnated with some low work function material, such as barium carbonate, and subsequently ohmically heated.

Hollow cathodes have been in existence for over ten years. Hollow cathodes have been developed to an advanced state of technology readiness for ion propulsion. Ionic propulsion may be defined as propulsion by the reactive thrust of a high-speed beam of similarly charged ions ejected by an ion engine. In ground tests they have demonstrated high emission currents of greater than 30 Amperes, and long lifetimes, with modest power requirements of less than 100 Watts. Hollow cathode plasma sources have demonstrated versatile and effective operation as plasma contactors in ground testing of various devices. This testing includes plasma bridge neutralizers for ion thrusters, plasma contactor demonstration experiments for the electrodynamic tether, and space station structure potential control experiments.

Hollow cathodes have also been flown in space as components of ion propulsion systems and spacecraft charging/charge-control systems, including ATS-6, SERT-II, SCATHA, and SCSR-1 flight experiments. Demonstrated capabilities in space tests include lifetimes of 10,000 hours and more than 300 restarts. NASA flight experiments have demonstrated hollow cathode plasma contactors to be effective in controlling both the negative charging and differential charging of the spacecraft frame. Hollow cathodes have been operated in space under a variety of orbital and environmental conditions; on spacecraft, including an Agena vehicle, on communication satellites, and on the space shuttle. Environments include those of low-earth orbits, sun-synchronous high inclination orbits, and geosynchronous orbits.

All of the above hollow cathode development was accomplished with mercury as the hollow cathode expellant, or "working fluid." For a variety of reasons, which includes spacecraft contamination, the present hollow cathodes preferentially use an inert gas, such as xenon, as the expellant. Subsequent to the transition from the use of mercury to xenon in the early 1980's, there have been, and continue to be, failures of hollow cathodes in the United States, in Europe, and in Japan. These have impacted both research and development activities and flight programs. The failures have apparently been primarily due to inadequate procedures and protocols to control contamination during the fabrication, assembly, testing, storage, handling, and operation of the cathodes; as well as, inadequate design and process features. To date, the only successful extended duration tests, that have been reported of using inert-gas hollow cathodes at high emission currents of greater than 1 Ampere, have been conducted, by the NASA Lewis Research Center. These successful extended duration tests were implemented by the use of the design features and processes that are further described herein.

U.S. Pat. No. 3,944,873, granted Mar. 16, 1976, to J. Franks, et al., discloses a hollow cathode of cylindrical shape. A cathode encloses an anode having a pair of screen electrodes, symmetrically disposed about and parallel to the plane of the anode. The anode has a central aperture and another aperture may be made in the cathode diametrically opposite the first aperture.

U.S. Pat. No. 4,049,989, granted Sep. 20, 1977, to R. H. Bullis, et al., discloses ion production using a permeable electrode having apertures and a central electrode. A wire mesh grid is placed symmetrically about the permeable electrode.

U.S. Pat. No. 4,087,721, granted May 2, 1978, to G. Mourier, discloses an ion source that is comprised of a hollow cathode discharge arrangement having an anode placed between two cathodes. The cathode has holes through which some of the ions of the plasma escape.

U.S. Pat. No. 4,377,773, granted Mar. 22, 1983. to A. Hershcovitch. et al., discloses an ion source that is comprised of a hollow cathode and an anode base having electrically connected anode covers.

U.S. Pat. No. 4,428,901, granted Jan. 31, 1984, to W. H. Bennett discloses a hollow cathode, that is held inside of a cathode holder, as well as, a hollow anode that is supported by a conducting support. A diode envelope surrounds the hollow cathode.

U.S. Pat. No. 4,894,546, granted Jan. 16, 1990, to R. Fukui et al., discloses a cylindrical hollow cathode having upper and lower circular anodes that are placed at the two ends of the cylindrical cathode, where each of the anodes have circular openings.

U.S. Pat. No. 5,075,594, granted Dec. 24, 1991, to R. W. Schumacher, et al., discloses a hollow cathode used for discharging ionized plasma of an ambient gas, such as xenon. A flat anode extends perpendicular to, and is intersected by, the axis of the cathode. A keeper/baffle electrode, which may also be a plate, is disposed between the cathode and anode. Even though this device is a low impedance device, it will not yield electron emission currents to an external electrode in the multi-ampere range, within a voltage range of 20 Volts.

U.S. Pat. No. 5,241,243, granted Aug. 31, 1993, to G. Cirri, discloses a plasma generator that is comprised of a hollow cylindrical cathode and one or more anodes.

U.S. Pat. No. 5,352,954, granted Oct. 4, 1994, to G. Cirri, discloses a plasma generator that is comprised of a hollow cylindrical cathode and one or more anodes having holes.

U.S. Pat. No. 5,569,976, granted Oct. 29, 1996, to N. V. Gavrilov, et al., discloses of an ion emitter that is comprised of a hollow cathode at one end and a coaxial rod-shaped anode at the other end. The hollow cathode encloses the rod shaped anode.

U.S. Pat. No. 5,581,155, granted Dec. 3, 1996, to A. I. Morozov, et al., discloses a plasma accelerator that is comprised of a hollow cathode and an annular anode.

All of the above referenced prior art relate to high voltage acceleration systems. Further, they do not teach of a selfregulating emission control system. None of the prior art relates to an ionic emission apparatus, having low current capability, with the exception of U.S. Pat. Nos. 5,075,594 and 4,428,901, which disclose the use of electron emission apparatus. Only U.S. Pat. No. 5,075,594, teaches of a low output impedance, whereas all of the others have an undesirable high output impedance, that is not suitable for use in space station applications.

In addition, none of the above referenced prior art provide an attained performance reliability having a demonstrated lifetime in excess of the present state-of-the-art 500 hours, when operated at emission currents of approximately 1 Ampere.

These devices in the past have exhibited unstable operating characteristics and shortened lifetimes as a result of design and processing problems. Until the initiation of the present program, there have been no inert gas hollow cathodes that had demonstrated lifetimes greater than 500 hours, when operated at emission currents greater than 1 Ampere.

The present invention differs from the aforementioned prior art inasmuch that the approach is not limited solely by the design of the apparatus but also includes the method of manufacturing processes and procedure in order to obtain a highly reliable and repeatable design commensurate with a high life expectancy. The advancements demonstrated in the manufacturing processing include contamination control procedures which cover hollow cathode component cleaning procedures, gas feed system designs and specifications, and hollow cathode activation and operating procedures.

Accordingly, it is therefore an object of the present invention to provide an electron emissive hollow cathode apparatus that will provide reliable, stable and repeatable operation over a lifetime that is in excess of 17,500 hours.

It is another an object of the present invention to provide an electron emissive hollow cathode apparatus that will provide reliable, stable and repeatable operation over a broad range of operating emission currents of at least a 6:1 ratio.

It is still another an object of the present invention to provide an electron emissive hollow cathode apparatus that will provide reliable, stable and repeatable operation, while permitting electron emission currents of up to 30 Amperes emission to an external anode, at voltages of less than 20 Volts DC.

It is a final object of the present invention to provide a method of manufacturing an electron emissive hollow cathode apparatus that when adhered to, will provide reliable, stable and repeatable operation over an expected lifetime that is in excess of 17,500 hours.

These as well as other objects and advantages of the present invention will be better appreciated and understood upon reading the following detailed description of the presently preferred embodiment taking in conjunction with the accompanying drawings.

SUMMARY OF THE INVENTION

The present invention relates to the design and processes that are required to fabricate long lived hollow cathode assemblies, which will exhibit stable and repeatable operating parameters.

These processes have been demonstrated for emission currents up to 24 Amperes and lifetimes greater than 10,000 hours, and they have been incorporated in a cathode design which is proposed for controlling the floating potential of International Space Station Alpha (ISSA). These design and processes permit stable and repeatable operation over a broad range of emission currents under variable and uncertain current demand, at electron emission currents up to 30 Amperes at potentials of less than or equal to 20 Volts, and with a life expectancy of at least 17,500 hours.

The International Space Station Alpha (ISSA) power system is designed with high voltage solar arrays which operate at output voltages of typically 140–160 Volts, and is configured with a "negative ground" that electrically ties the habitat modules, structure, and radiators to the negative tap of the solar arrays. This electrical configuration and the plasma current balance that results will cause the habitat modules, structure, and radiators to float to voltages as large as 120 Volts with respect to the ambient space plasma. As a result of these large negative floating potentials, there exists the potential for deleterious interactions of ISSA with the space plasma. These interactions may include arcing through insulating surfaces and sputtering of conductive surfaces due to the acceleration of ions by the spacecraft plasma sheath. Both of these processes may result in changes in the surface material properties, in destruction of coatings and in contamination of the surfaces due to redeposition.

The space experiment SAMPIE (for Solar Array Module Plasma Interactions Experiment) was recently flown on the Space Transportation System STS-62 and provided valuable validation of the theoretical models of spacecraft charging that were used to predict the station floating potentials. The flight data that was acquired from this experiment, which quantified the current collection to station solar array elements, confirmed the need for a plasma contactor to control the potential of the space station.

A decision was made, that was based on its potential effectiveness, to baseline a plasma contactor system on ISSA as the solution to alleviate plasma interactions. Consequently, NASA initiated a plasma contactor development program as a portion of the ISSA electrical power system.

There are several major derived operational requirements for the station plasma contactor system which include: (a) the capability to control station potential to within 20 Volts of space plasma potential; (b) emit electron currents up to 30 Amperes under dynamic and variable conditions; (c) operate for up to 17,500 hours without degradation; (d) minimize consumables; (e) be single-fault tolerant in design; (f) be compatible with all space station utilities; (g) be robotically serviceable; and (h) incorporate health monitoring instrumentation, including instrumentation to measure the plasma return current.

For the ISSA application, efficient and rapid emission of high electron currents is required by the plasma contactor system under conditions of variable and uncertain current demand. A hollow cathode assembly is well suited for this application and was therefore selected as the criteria for the design of the station plasma contactor system.

BRIEF DESCRIPTION OF THE DRAWINGS

FIG. 4A is an enlarged sectional view showing the cathode tube, posts, seal fitting as taken through section 4A—4A of FIG. 4.

FIG. 4B is an enlarged cross section view showing the cathode tube, posts and mounting adapter taken through section 4B—4B of FIG. 4A.

FIG. 9 is a sectional view of the keeper sub-assembly with keeper cap and keeper tube.

FIG. 10 is an enlarged view of the disk orifice plate.

FIG. 11 is a sectional view of the disk orifice plate taken through 11—11 of FIG. 10.

FIG. 12 is an enlarged sectional view of the cathode tube.

FIG. 13 is an end view of the cathode tube; and,

FIG. 14 is an end view of FIG. 9, the keeper sub-assembly.

DETAILED DESCRIPTION OF THE PREFERRED EMBODIMENT

The design and manufacturing process of the present invention was developed to produce Hollow Cathode Assemblies that could operate over a broad range of emission currents up to 30 Amperes, at low potentials, with lifetimes of at least 17,500 hours.

Hollow cathode assemblies can vary in overall size, cathode heating method and operation depending on their operating requirements, feed gas and intended application. These devices have been implemented as components of ion thrusters, as well plasma contactors for spacecraft charge control. These assemblies are also used for material processes such as thin film deposition and ion beam milling.

The present invention, by using the design and associated processes as described herein, produces cathode assemblies that have stable and repeatable operating conditions of both discharge current and voltage. A lifetime of greater than 10,000 hours, and having an expected or projected lifetime of greater than 17,500 hours was demonstrated, where the present state-of-the-art is less than 500 hours at emission currents in excess of 1 Ampere. Stable operation can be provided over a large range of operating emission currents, up to a 6:1 ratio, and can emit electron currents of up to 30 Amperes in magnitude to an external anode (simulating the current drawn to a space plasma) at voltages of less than 20 Volts.

Figure 1:
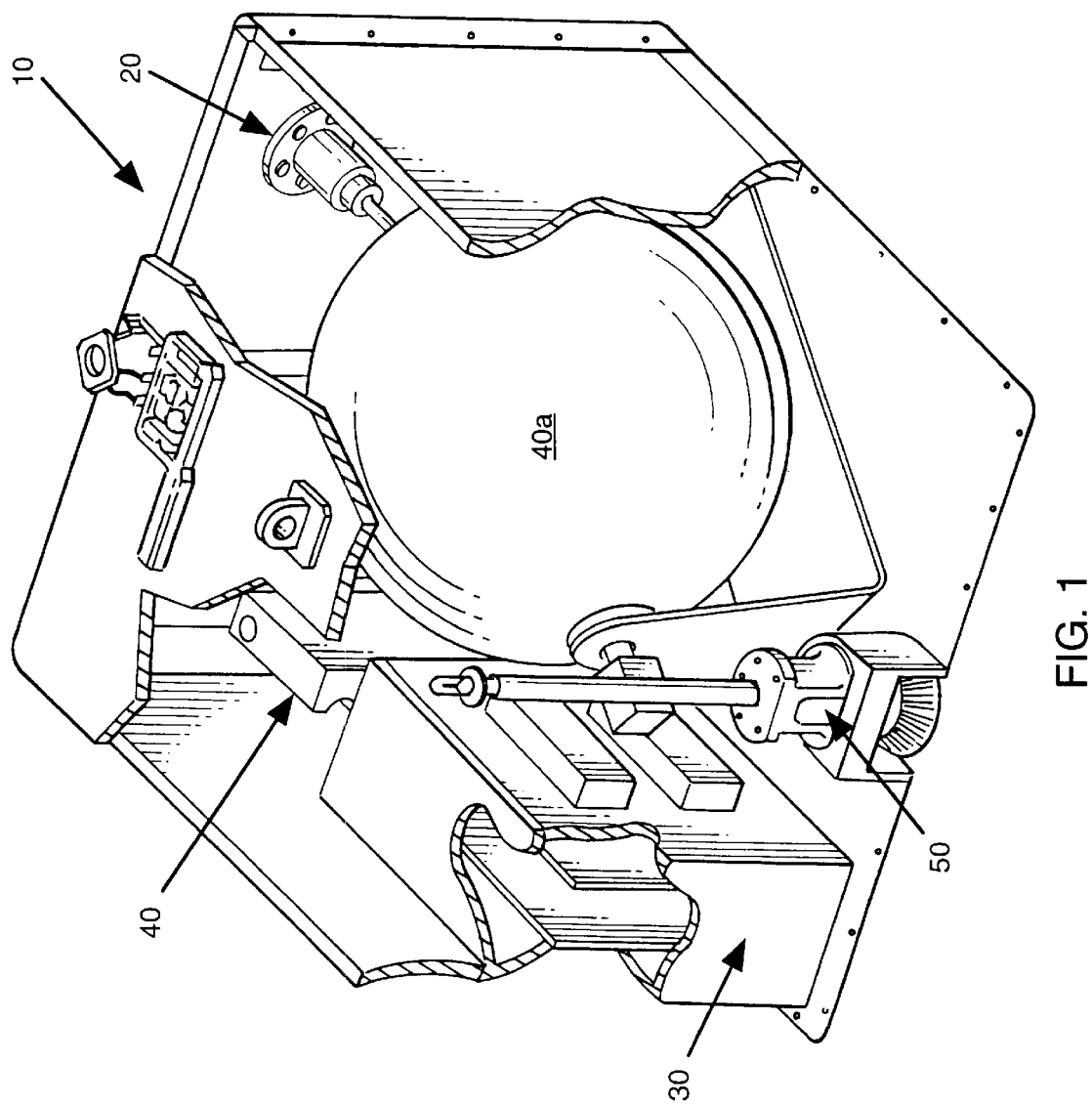
FIG. 1 is a perspective cutaway view of the Plasma Contactor System (PCS), which incorporates the use of the Hollow Cathode Assembly.

FIG. 1 is the preferred embodiment of the ISSA Plasma Contactor System 10. The Plasma Contactor System (PCS) 10 is comprised of four subsystems: they are, a Hollow Cathode Assembly (HCA) 20, a Power Electronics Unit (PEU) 30, an Expellant Management Unit (EMU) 40, and an Orbit Replaceable Unit (ORU) 50.

Figure 2:
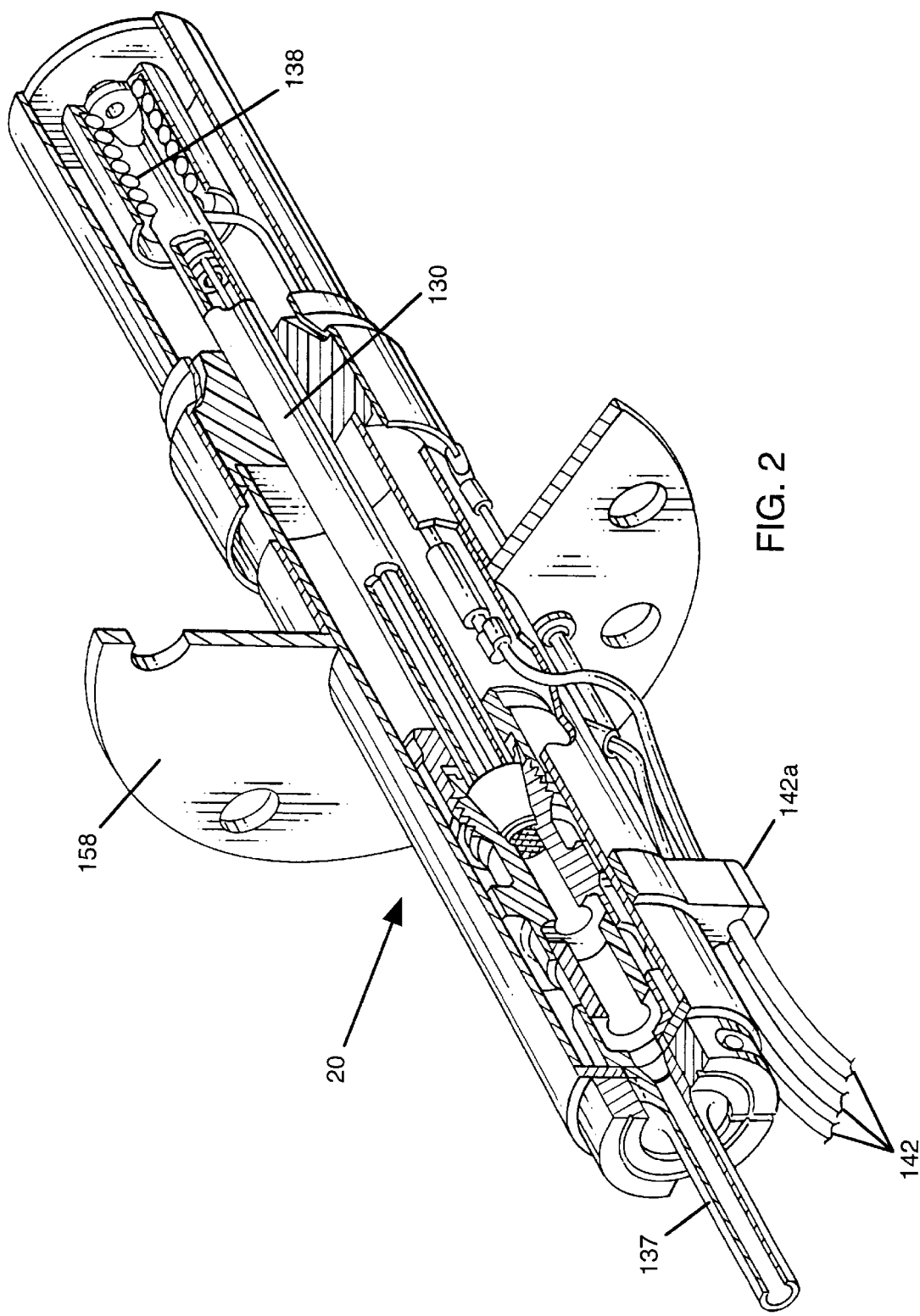
FIG. 2 is a perspective cutaway view of the space station Hollow Cathode Assembly (HCA).

FIG. 2 is a perspective view of the completed Hollow Cathode Assembly (HCA) 20, one of the subsystems of the ISSA Plasma Contactor System (PCS), shown with the cathode tube 130, xenon feed line 137, swaged heater 138, connective wires 142 stabilized in wire clamp 142a, of the HCA, that mounts to the PCS by mounting flange 158.

Figure 3:
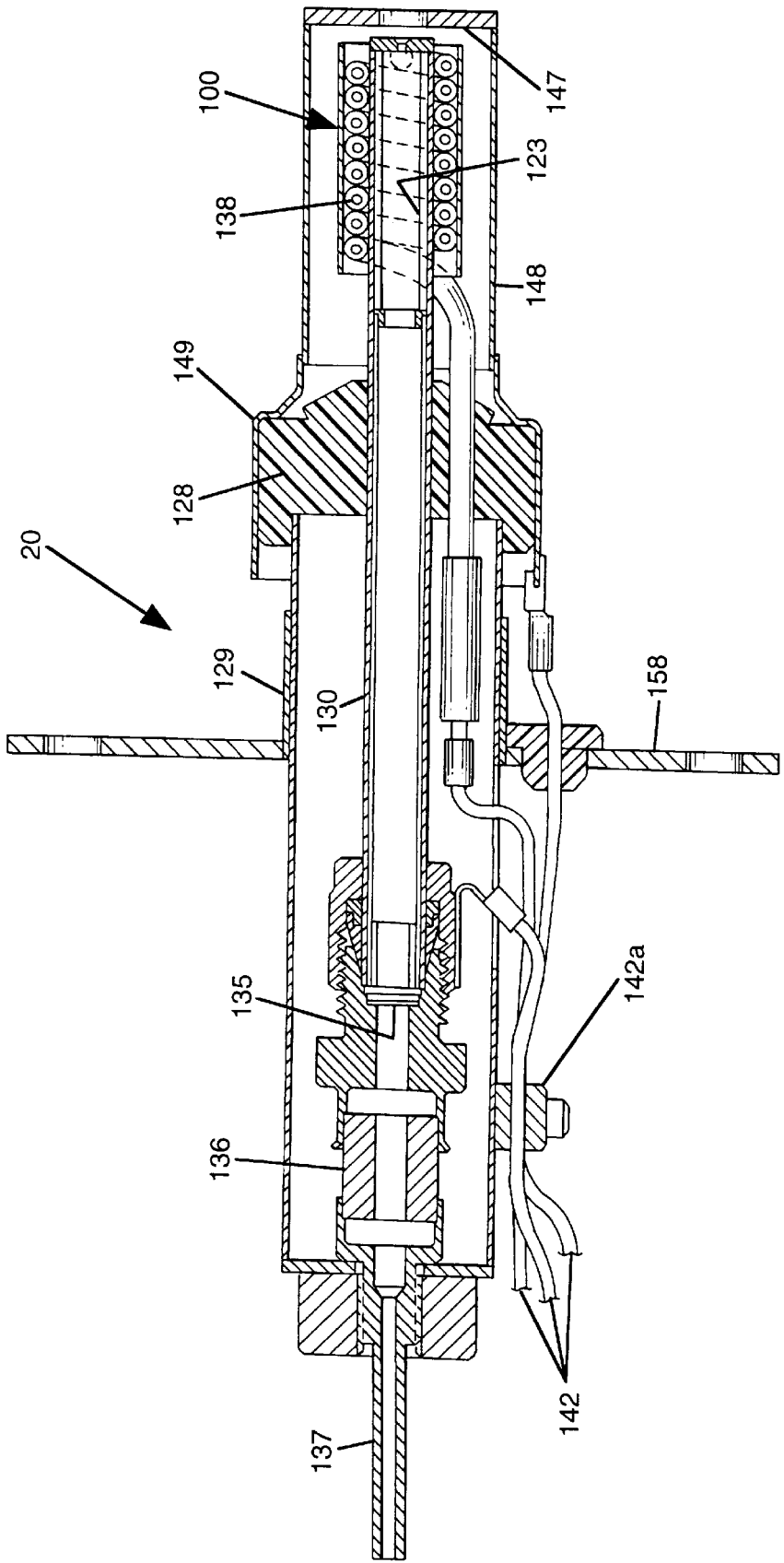
FIG. 3 is a sectional view of the space station Hollow Cathode Assembly giving the functional attributes.

The Hollow Cathode Assembly 20 (HCA), as shown in the sectional view of FIG. 3, is the active electron emitter source. A cover sheath 129 stabilizes a hollow cathode tube 130 in fixed position within the sheath. The HCA is further comprised of a hollow cathode 130, a low-work function insert 123 for electron emission, an anode 100, a heater 138, and an electrical isolator 128. The present invention is of an enclosed-keeper geometry, that operates using xenon gas. The over-riding criteria used in the design of an HCA is one that satisfies the potential control requirement of less than a 20 Volt clamping voltage and one that maximizes the expectations for long life. Based on these requirements, an enclosed-keeper hollow cathode geometry was used.

Xenon gas is introduced into the Hollow Cathode Assembly 20 via the xenon feed line 137. The flow of the pressurized xenon gas passes through the expellant isolator tube 136 and subsequently through screen 135. The expellant isolator tube 136 provides the electrical isolation of the cathode common from the spacecraft ground to permit the direct measurement of the emission current.

The xenon gas then flows into the Hollow Cathode 130, where the cathode is electrically isolated from the anode by electrical isolator 128. The cathode insert 123 is the active electron emissive source. The anode assembly 100 sustains the operation of the Hollow Cathode 130. The sheathed heater 138 raises the cathode temperature for activation and ignition of the Hollow Cathode Assembly 20. The entire HCA assembly mounts to the side wall of the Plasma Contactor System (PCS) 10, via the cathode assembly mounting flange 158. Keeper cap 147, keeper tube 148 and keeper collar 149, are also disclosed in FIG. 3.

Figure 4:
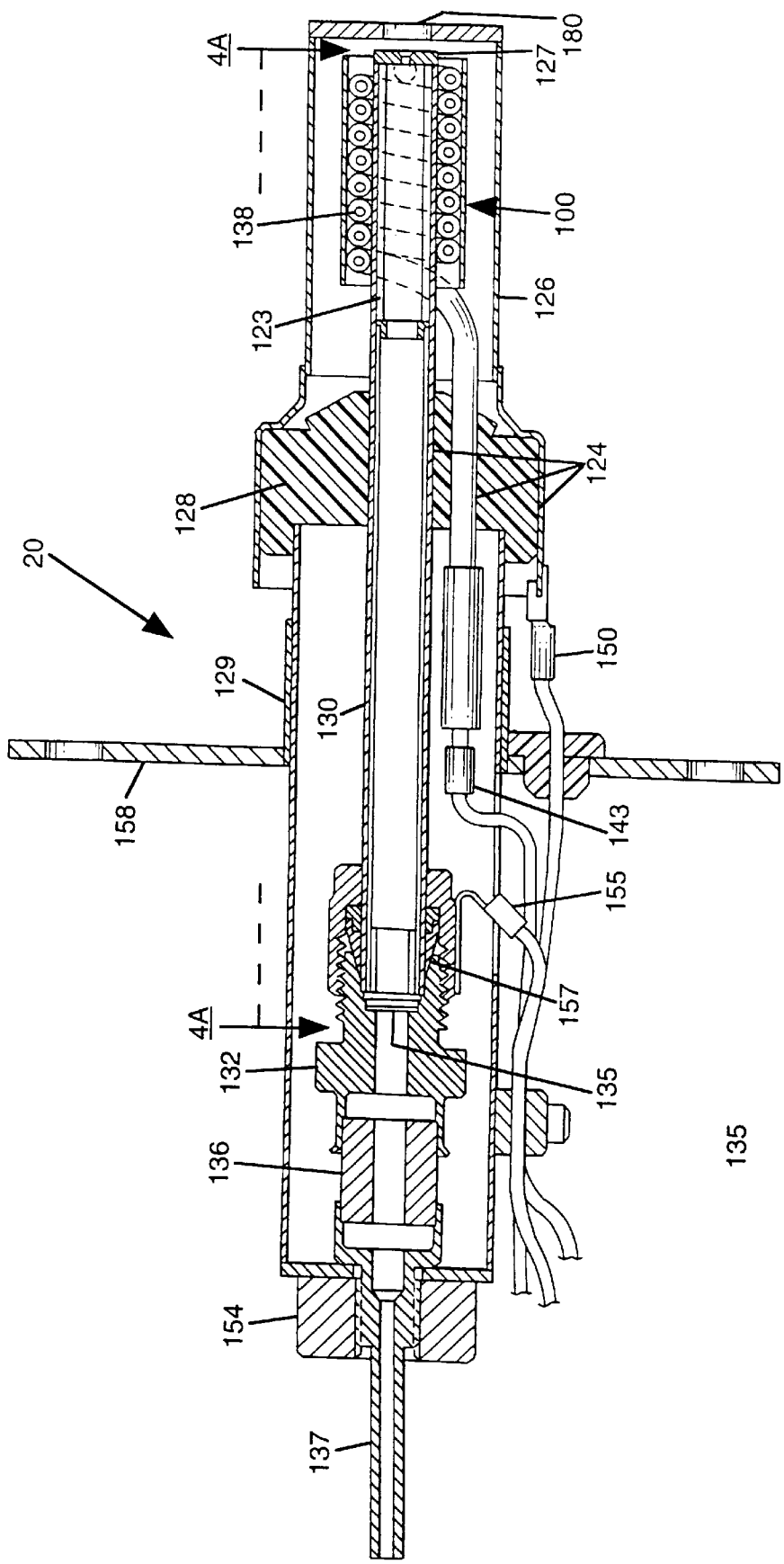
FIG. 4 is a sectional view detailing the components of the space station Hollow Cathode Assembly.

Turning now to FIG. 4, the HCA design of the present invention is comprised of a hollow cathode 130, an anode 100, a heater 138, an expellant isolator tube 136, and an electrical isolator 128. The cathode assembly mounting flange 158 secures the HCA assembly to the side wall of the Plasma Contactor System (PCS) 10.

The hollow cathode itself is comprised of a refractory alloy tube 130 with an orifice plate 127 welded on one end. The tube is several millimeters in diameter, while the orifice 127a, (shown in FIG. 10), in the plate 127 is a fraction of a millimeter in diameter. An insert 123, which is located within the hollow cathode, serves as a low-work function electron source, and is electrically connected to the tube 130. A heater 138, used to raise the temperature of the cathode during activation and to facilitate ignition, surrounds the downstream end of the hollow cathode tube 130.

The HCA incorporates a cylindrical anode 100 that surrounds the hollow cathode 130 that is in close proximity. The anode 100 is also referred to as the keeper as it maintains, or keeps the cathode emitting during conditions when there is no external emission current demanded. The anode 100 is described as being enclosed because it completely encapsulates the hollow cathode except for a single aperture 180, found directly downstream of the hollow cathode orifice 127a found in orifice plate 127. This design is more efficient than an open-keeper geometry because of the higher internal pressures in the cathode-keeper region.

Upstream from the hollow cathode tube 130 is an expellant isolator tube 136 that isolates the HCA from the ISSA structure. This allows the connection from the HCA cathode to the station single point ground to be made via cable, and this current can then be monitored by instrumentation within the power electronics unit.

An engineering model design of the HCA has been completed and several units have been fabricated and are under test. The mass of the HCA, less the power cable and connector, is approximately 125 grams (4.4 oz.). It is cylindrical in shape, and has a length of approximately 11.5 cm. and maximum diameter of approximately 2.8 cm. The HCA has three interfaces to the Plasma Contactor System (PCS) 10 of FIG. 1, including a mechanical attachment point to the Orbital Replaceable Unit (ORU) 50, a single xenon gas line 137 to the Expellant Management Unit (EMU) 40, and a 3-conductor electrical cable to the Power Electronics Unit (PEU) and Controller 30.

In reference to FIG. 4A, an enlarged sectional view taken through 4A—4A of FIG. 4, there is further disclosed an active electron emitter insert 123, the cathode tube 130, leg projections 131, seal fitting 132, seal fitting nut 132a, mounting adapter 133, leg holder 134, screen 135, and compression fitting adapter 157.

Referring to FIG. 4B, an enlarged cross section view of the cathode tube taken through section 4B—4B of FIG. 4A, there is shown cathode tube 130, leg projections 131, mounting adapter 133.

Figure 5:
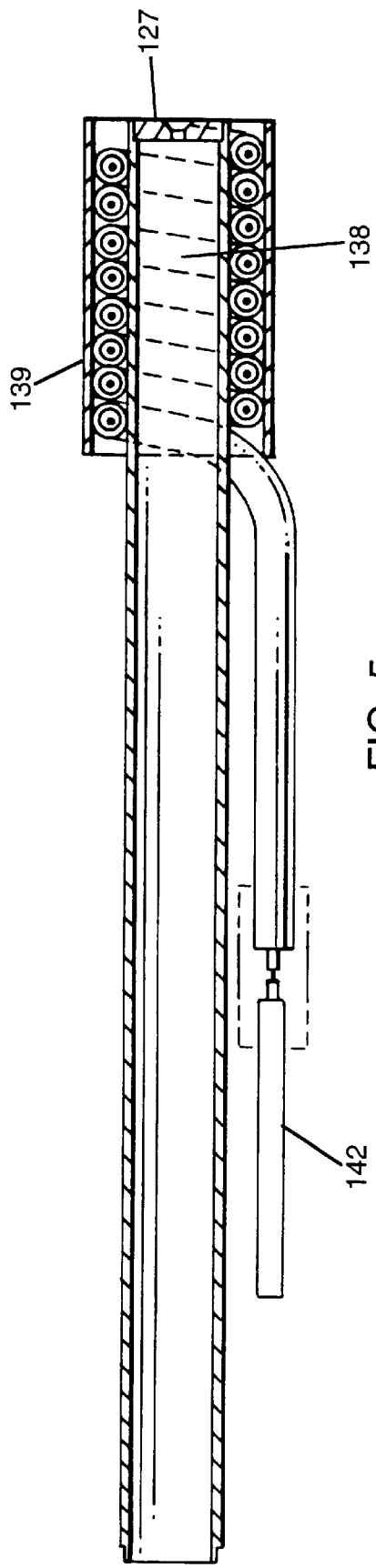
FIG. 5 is a sectional view of the cathode tube and swaged heater sub-assembly.

FIG. 5, a sectional view of the cathode tube and swaged heater sub-assembly, better discloses disc orifice plate 127, swaged heater 138, radiation shield 139, and connective cable 142.

Figure 6:
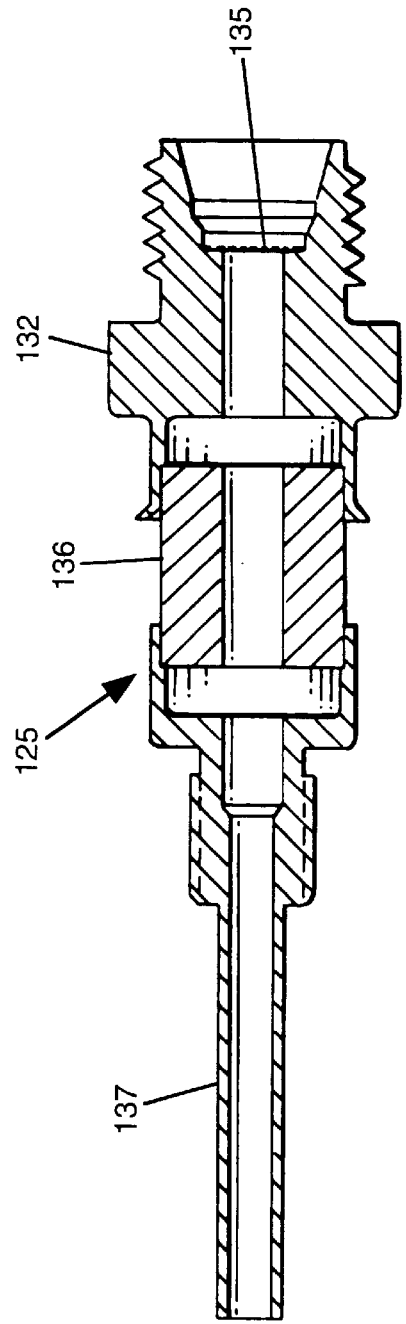
FIG. 6 is an enlarged sectional view of the seal fitting, isolator tube, screen, and Xenon feed line.
Figure 7:
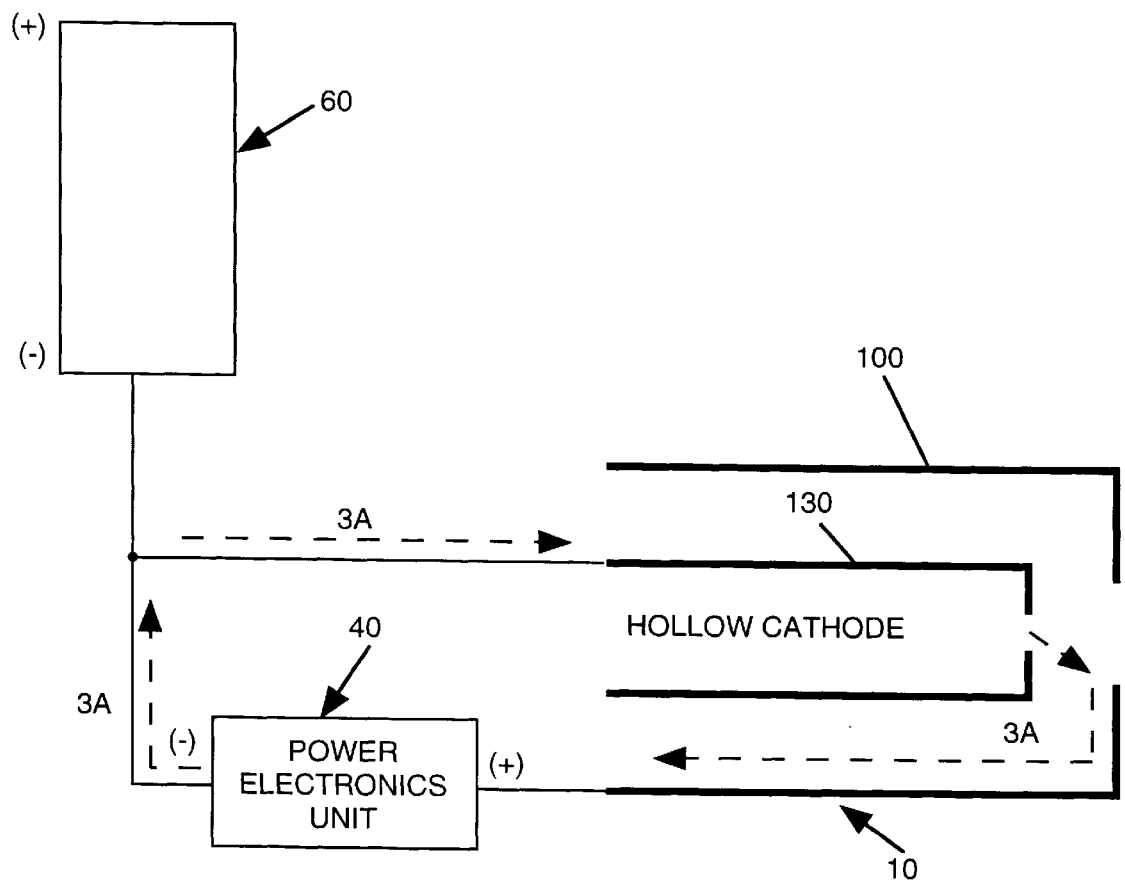
FIG. 7 is a schematic view of the "idle" mode of operation, where the solar panel arrays are eclipsed.
Figure 7A:
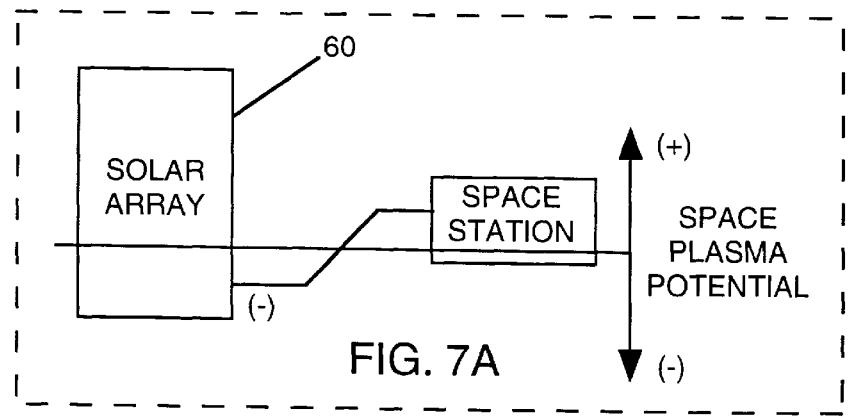
FIG. 7A is a schematic view that diagrammatically illustrates the "idle" mode of operation.
Figure 8:
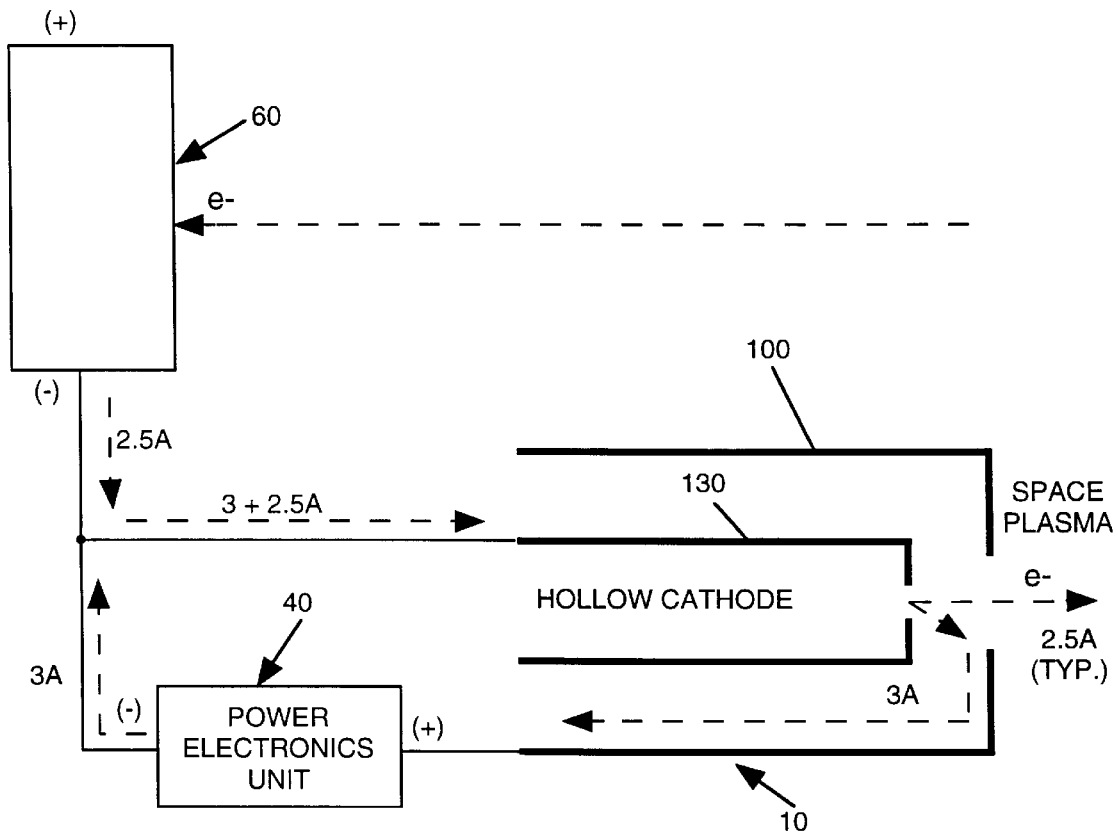
FIG. 8 is a schematic view that illustrates the "clamping" mode of operation, where the solar panel arrays are fully illuminated.
Figure 8A:
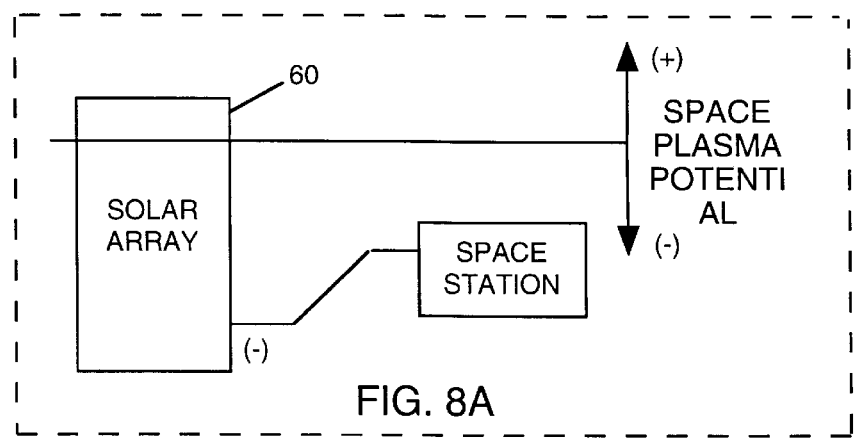
FIG. 8A is a schematic view diagrammatically illustrates the "clamping" mode of operation.

FIG. 6 is an enlarged sectional view of the expellant isolator sub-assembly showing seal fitting 132, screen 135, expellant isolator tube 136, and the xenon feed line 137.

Referring to FIGS. 7, 7A, 8 and 8A, the active emission to the space plasma of electron current at least matching the net electron current collected on the station solar arrays, more commonly referred to as the "clamping" mode, is required for only a small portion of the station orbital period. This period occurs during approximately one-third of the orbit, from dawn through noon when the solar arrays are illuminated, generate power, and face in the ram direction. During the remainder of the orbital period the hollow cathode plasma source may be either operated in an "idle" mode or turned off. Both the idle-mode and clamping-mode of operation are illustrated in FIGS. 7 and 7A, and 8 and 8A, respectively.

The critical and distinctive features of the fabrication and assembly processes of the cathode assembly include (1) the cathode tube cleaning process, (2) the assembly of the cathode and (3) the heater fabrication, assembly, test and inspection processes.

Hollow Cathode Assembly Fabrication and Assembly

The cathode assembly design details, manufacturing processes, material handling, and rigorous acceptance testing are further described in the following paragraphs. Failure to follow these steps may result in a cathode assembly that has unsteady voltage-current characteristics and has a relatively short life expectancy.

Preliminary Cleaning Procedure:

The Hollow Cathode Assembly (HCA) cleaning procedure of metal parts after component fabrication and prior to assembly is as follows:.

1. Hand contact will be only with use of hand-coverings, such as unpowdered latex or nitrile gloves.
2. Clean any residual dirt or grease from the part first by wiping it with a clean, lint-free cloth or tissue and reagent grade acetone, then 95% ethyl alcohol.
3. Completely immerse the part to be cleaned in a beaker, that is impervious to alcohol and to acetone and place the beaker in an ultrasonic cleaner, having a heater.
4. Place the part in an ultrasonic cleaner that is under a fume hood. Start agitation and heater of the ultrasonic cleaner. Agitate and heat for 30 minutes; starting from when the solution reaches a high temperature of either 56 degrees C when using acetone or 60 degrees C when using ethyl alcohol. Re-position the part as necessary using clean tweezers to ensure that the part is completely immersed.
5. Remove the part from the beaker or container and drain. The part should be handled only with tweezers.
6. Then, place the part in a clean beaker and fill with clean 95% ethyl alcohol. Completely immerse the part.
7. Repeat steps 3 through 5 using 95% ethyl alcohol.
8. Blow dry with clean, oil-free nitrogen.
9. Store the cleaned part in a nitrogen-purged, marked hermetically sealed plastic bag, using a hermetic bag sealer or equivalent.

1.0 Cleaning Procedures for the Cathode Tube and Disc Orifice Sub-assembly

The cathode tube is shown in FIGS. 12 and 13; and the disk orifice plate in FIGS. 10 and 11.

Note:

Use clean powder-free latex examination gloves when handling all HCA parts. Steps 3.6–3.8 in this procedure requires that the cathode tube sub-assembly(ies) be submitted for vacuum firing.

1.1 Clean any residual dirt or grease from the interior of the cathode tube sub-assembly. Run a clean, lint-free cloth strip dampened with reagent grade acetone in and out of the cathode tube sub-assembly until no dirt or grease appears on the cloth. Inspect the inner cathode tube using a Mini-Mag Lite to confirm that there is no visible dirt or particulate contamination. Then blow the sub-assembly dry with ultra-high purity nitrogen.

1.2 Repeat 1.1 using clean 95% ethyl alcohol.

1.3 Clean cathode tube sub-assembly following the Preliminary Cleaning Procedure.

1.4 Store the cathode tube sub-assembly(ies) in a properly labeled, nitrogen-purged hermetically sealed bag(s) until the vacuum firing procedure is conducted.

1.5 Using a vacuum furnace, vacuum fire each sub-assembly. Pump down the furnace to a vacuum level of less than $1 \times 10^{-3}$ torr. Pre-heat the furnace. Ramp at 10 degrees F/minute to 2000 degrees F; hold for 30 minutes, then ramp to 2200 degrees F at 10 degrees F/minute; hold for an additional 30 minutes. Turn off heat and cool to room temperature before venting.

2.0 Hollow Cathode Assembly (HCA) Assembly Procedures

Note:

All assembly procedures must be conducted in a Class 1000 clean room on a cleaned stainless steel or formica clean room-rated table 2.1 Cathode Tube Sub-Assembly FIGS. 12 and 13 best illustrate the cathode tube sub-assembly. The insert cathode sub-assembly 123 is procured as a completed sub-assembly. The cathode tube 130 is welded to the disc orifice plate 127 and vacuum fired.

2.2 Swaged Heater Sub-Assembly Fabrication and Installation

With reference to FIG. 5, install the swaged heater 138 onto the cathode tube 130 using Saureisen Electrotemp, Cement #8.

2.3 Keeper Sub-Assembly Fabrication and Assembly

As shown in FIGS. 9 and 14, the keeper sub-assembly 126 is comprised of keeper cap 147 having aperture 180, and keeper tube 148; the keeper collar 149, is shown in FIG. 3.

2.4 Expellant Isolator Sub-Assembly Preparation

Referring to FIG. 6, the expellant isolator is shown in section. The expellant isolator sub-assembly 125 is procured as a brazed sub-assembly. It is comprised of xenon feed line 137, nut 154, expellant isolator tube 136, seal fitting 132 and screen 135.

2.5 Keeper Brazing Sub-Assembly Brazing Procedures

Braze the sleeve 141 to the swaged heater sheath 138; the swaged heater sheath 138, the cathode tube 130, and the keeper collar 149, to the electrical isolator 128; and the keeper tube 148 to the keeper collar 149, shown in FIG. 3.

2.6 Anode Connector Assembly

The e-beam weld technician shall insert the anode connector 150 into the keeper collar 149.

2.7 Insert Cathode Sub-Assembly Installation Procedure

Install insert cathode sub-assembly 123 into cathode tube 130, butting the insert cylinder securely against the back of the disc orifice plate 127, while maintaining the position of the insert legs at 120 degree intervals, with no cross-over. Install leg holder 157, so that the insert legs slide into the slots in the leg holder and that the upstream plane of the leg holder is flush with the upstream end of the cathode tube 130.

2.8 Expellant Isolator Sub-Assembly Installation Procedure

Install expellant isolator sub assembly 125 onto cathode tube 130 while being sure that the cathode tube is fully butted against the expellant isolator sub-assembly.

3.0 Swaged Heater Compaction Test Procedure

Remove all burrs from the edges from the swaged heater samples using a fine-tooth file. Wipe the sheaths clean with lint-free tissue. Measure the mass of the test samples with the analytical balance to within $1 \times 10^{-3}$ grams. Place test samples in a clean beaker and completely immerse the samples in kerosene for a minimum of 24 hours.

Remove the test samples from the beaker using clean tweezers. Carefully wipe off any residual kerosene from the sheath surface using a lint-free tissue only. Remove residual kerosene from the magnesium oxide by placing the cloth onto the kerosene and allowing it to absorb the liquid, while not making contact with the magnesium oxide. Measure the mass of the test samples with the analytical balance to within $1 \times 10^{-3}$ grams. Remove the magnesium oxide from each sample by placing the sample in a vice with cleaned flat, smooth surfaces and partially flattening the outer sheath. Loosen the vice, rotate the sample 90 degrees and deform the sheath again.

Remove the sample and dislodge the loose magnesium oxide with a 0.020 inch diameter drill bit (avoid removing tantalum material). Repeat this process until the center conductor can be pulled out and all the magnesium oxide can be remove from the sheath. Remove residual magnesium oxide by rinsing the sheath and center conductor in clean ethyl alcohol, blowing compressed gas through the sheath interior, and by wiping the sheath and center conductor. Measure the mass of the sheath and center conductor with the analytical balance to within $1 \times 10^{-3}$ grams.

Calculate the compaction percentage of each sample using the following equation:

$$\% \text{ Compaction} = \frac{M_{pre} - M_{sh/w}}{\frac{M_{post} - M_{pre}}{D_{kero}} + \frac{M_{post} - M_{sh/w}}{D_{MgO}}} \times \frac{1}{D_{MgO}}$$

where $D_{kero} = 0.820$ grams/cm. and $D_{MgO} = 3.58$ grams/cm.

Swaged heater compaction shall be 84%±4%. Reject the heater it fails to meet this compaction range.

3.1 Swaged Heater Thermal Imaging Scan Procedure

Suspend the swaged heater using the alligator clips attached to the center conductor at either end to support the heater. Be sure that the swaged heater does not make contact with any object. Contact with anything will create a heat conduction path that will invalidate temperature distribution results.

Using a Kikusui Power Supply Model PAD55-6L, or equivalent, connect the positive terminal to one end of the swaged heater center conductor and connect the opposite end of the swaged heater to a Fluke Model 77 Series II Multimeter, or equivalent, and to the negative terminal of the power supply to measure the heater current.

Orient the Inframetrics Model 600 Thermal Imaging Radiometer, or equivalent so that the temperature distribution through out the entire length of the swaged heater can be scanned. Set the emissivity to 1.0. Use a black cloth as a black background to reduce background emissions.

With the power supply in current control mode, raise the current to 2.40 Amperes. Wait for approximately 10 minutes for the swaged heater temperature to rise to approximately 17–23 degrees C. Using the thermal imaging radiometer, measure the swaged heater temperature and temperature along the length of the swaged heater sheath.

The temperature distribution along the length of the swaged heater shall be less than ±5 degrees C.

The critical and distinctive test processes which insure cathode assembly longevity include contamination control procedures that are implemented for: (1) the expellant feed system, (2) the cathode insert activation sequence, as well as (3) the cathode ignition.

4.0 Xenon Feed Systems Test Procedures

This procedure is for the design and implementation of a Hollow Cathode Assembly (HCA) xenon feed system to satisfy the specified contamination levels and calibration procedure requirements, to maintain compatibility with long-life HCA operation.

Secure all components, including the xenon gas bottle and any extended lengths of gas tubing, to a gas panel to preclude relative motion and mitigate loosening of fittings due to vibration or bending moments.

Conduct an xenon feed system bake-out, as described in 4.2.

Conduct a leak rate determination, as described in 4.3.

After the xenon feed system has been exposed to the vacuum facility which is at $<1.3 \times 10^{-4}$ Pa ($<1.0 \times 10^{-6}$ torr) for a minimum of 12 hours, close the pressure regulator, the capacitance manometer shut-off valve, the purge line shut-off valve, and all metering valves. Open the xenon bottle valve fully. Pressurize the xenon feed system to 20–30 psig by adjusting the second stage pressure of the pressure regulator.

4.1 Hollow Cathode Assemblies Laboratory Xenon Feed System Calibration

The following procedures provide accurate calibrations of heat transfer type flow transducers for determination of true xenon volumetric flow rates at standard temperature and pressure (i.e. 0 degrees C and 101325 N/m², respectively), assuming the use of a simple 'bubble-calibration' technique. This technique provides repeatable and accurate calibration data when compared to data obtained using primary standards which implement more sophisticated measurement techniques. These procedures are anticipated to be transportable to calibration of the xenon volumetric flow rates of the flight xenon feed system.

Conduct the following calibration:

Calibrate the flow meter/controller over a range of flow rates of 4.0 to 8.0 sccm, in increments of 0.5 sccm using the following equation:

$$\text{True Flow [sccm]} = \frac{V}{t} \times \frac{P - P_v}{P_{std}} \times \frac{T_{std}}{T}$$

where:

V=glass tube volume, cc=10 cc t=time to fill volume, minutes

P=barometric pressure, in. of Hg $P_v$=vapor pressure of water at the ambient temperature and barometric pressure, in. of Hg $P_{std}$=standard pressure, 29.92 in. of Hg $T_{std}$=standard temperature, K=273.14 K T=xenon temperature [assumed to be equal to the ambient temperature], K Plot the true flow rate as a function of the indicated flow rate and use linear regression to obtain a calibration equation for the flow meter.

4.2 Hollow Cathode Assembly (HCA) Laboratory Xenon Feed System High Temperature Bake-out.

The following procedure should be conducted whenever a pressurized portion of the xenon feed system has been exposed to air (e.g. after assembly, a xenon bottle replacement, feed system component replacement, etc.).

Expose the xenon feed system to a vacuum facility held at a pressure of less than $1.3 \times 10^{-4}$ Pa ($1.0 \times 10^{-6}$ torr).

These procedures are implemented to remove adsorbed oxygen and oxide-bearing compounds (moisture, etc.) from the internal surfaces of the feed system lines and components. Adsorption of these constituents occurs when the interior of the system is exposed to atmosphere (such as during modifications to the feed system including xenon bottle and feed system component replacements). Outgassing of these adsorbed constituents into the xenon gas stream during operation of the hollow cathode assembly may result in contamination of the cathode insert and rapid failure of the hollow cathode assembly. These procedures, when implemented, have demonstrated more than 18,000 hours of xenon hollow cathode operation.

Monitor the feed system temperature with a Type K thermocouple at various locations. Gradually increase the heater tape input power until a temperature range between 50 and 120 degrees C is reached at various locations on the feed system. Maintain these temperatures for 24 hours. Upon completion, allow the xenon feed system to cool to room temperature while under pressure.

4.3 Leak Rate Determination of Xenon Feed Systems.

Conduct this procedure whenever a pressurized portion of the xenon feed system has been exposed to air (e.g. after feed system assembly, a xenon bottle replacement, feed system component replacement, etc.).

The following procedure describes a rate-of-rise test which is used to define both the out-gassing rate of adsorbed constituents from feed system interior surfaces and the leak-integrity of the xenon feed system to cross-diffusion of atmospheric gases.

Close only the valves that expose the xenon feed system to the vacuum facility and ensure that all other valves, including the pressure regulator, are open: then start data acquisition. Conduct this test for a minimum of 24 hours. At the completion of the test, stop data acquisition and expose the xenon feed system to the vacuum facility which is at $<1.3 \times 10^{-4}$ Pa ($<1.0 \times 10^{-6}$ torr) by opening all closed valves. The leak rate is determined using the following equation:

$$\text{Leak Rate [sccm]} = \frac{V}{RT} \times \frac{dp}{dt} \times F_{convert}$$

where:

V=volume of feed system exposed to capacitance manometer

R=Specific Gas Constant of air [287 J/kg-K]

T=average ambient temperature throughout test [K dp/dt slope [Pa/sec j]

$F_{convert}$=Conversion Factor=$4.98 \times 10'$ [sccm-sec/kg]

The leak rate shall be less than $1.5 \times 10^{-5}$ sccm.

Continue to evacuate the feed system for a minimum of 12 hours.

4.4 Determination of Xenon Gas Purity

The following is a listing of elements known to be detrimental to HCA lifetime and performance.

Non-Metals: Carbon, Oxygen, Chlorine, Fluorine, Phosphorous and Sulfur

Alkali Metals: Sodium and Potassium

Transition Metals: Titanium, Zirconium, Hafnium, Chromium, Manganese, Iron, Cobalt, Gold, Silver, Platinum and Zinc Other Metals: Silicon, Tin, Antimony, Lead, and Bismuth The measured xenon purity shall be greater than 99.999%.

The xenon shall have the following measured impurity levels:

Less than 0.1 ppm Oxygen ($O_2$)

Less than 0.1 ppm Water ($H_2O$)

Less than 0.5 ppm Carbon Monoxide (CO)

Less than 0.5 ppm Carbon Dioxide ($CO_2$)

Less than 0.1 ppm Carbon Tetrafluoride ($CF_4$)

Less than 0.1 ppm Total Hydrocarbons

Less than 1 ppm Nitrogen ($N_2$)

Less than 2 ppm Hydrogen ($H_2$)

Less than 5 ppm Krypton (Kr)

Less than 1 ppm Argon (Ar)

Balance Xenon

Flow xenon from the xenon feed system into the sample bottle at 6 sccm. When the fill is complete, ship the sample bottles to the vendor for analysis.

4.5 Conditioning the impregnated insert of the Hollow Cathode Assembly.

These procedures are to be conducted subsequent to every exposure of the HCA to air, at pressures above $1.3 \times 10^{-2}$ Pa ($1.0 \times 10^{-4}$ torr) and prior to ignition. An oil-free facility with a base pressure of $<6.7 \times 10^{-4}$ Pa ($<5.0 \times 10^{-6}$ torr) is required.

4.5.1 Procedure

All procedures are to be conducted while maintaining a facility pressure of $<6.7 \times 10^{-4}$ Pa ($<5.0 \times 10^{-6}$ torr).

Install the HCA in a vacuum of $<5.0 \times 10^{-6}$ for at least 12 hours (to allow for outgassing of the HCA and its insert) prior to initiation of the conditioning sequence.

Energize the heater to 3.85 Amperes having a corresponding critical temperature of 550° C. for a minimum of 3 hours.

De-energize the heater for half an hour.

Energize the heater to 7.2 Amperes having a corresponding critical temperature of 550° C. for 1 hour.

De-energize the heater for a minimum of at least one-half hour.

4.6 Procedure necessary for ignition of the gaseous electrical discharge between cathode and anode electrodes of the Hollow Cathode Assembly.

The HCA must be conditioned per the procedure in the preceding section 4.5 prior to ignition. If the HCA has been exposed >$1.3 \times 10^{-2}$ Pa ($1 \times 10^{-4}$ torr) at any time subsequent to conditioning, the conditioning procedure must be repeated before an ignition may be attempted.

These procedures are to be initiated at a pressure <$6.7 \times 10^{-4}$ Pa ($5 \times 10^{-6}$ torr).

4.6.1 Requirements:

4.6.1.1 Ignition pulse generator circuit requirements:

The ignition pulse generator output shall have a magnitude of 750±100 Volts with a leading-edge rate-of-rise of >150 V/microsecond.

The ignition pulse duration shall be less than 20 microseconds.

The ignition pulse generator circuit output shall have a frequency of 10 Hz.

The pulse ignitor shall be active on power up of the anode power supply. When the anode current of 0.5 Amperes is established, the charging stage of the ignition pulse generator shall be disabled until the circuit current is extinguished. The ignitor shall automatically engage upon involuntary discharge extinction.

4.6.1.2 Anode power supply stage requirements:

The anode power supply stage shall be provided, having nominal characteristics of +40 VDC at 3.0 ADC current.

4.6.1.3 Heater power supply requirements:

The heater power supply shall be energized until the anode current exceeds 2.5 ADC.

4.6.2 Procedure

Confirm that the HCA has not been exposed to air at pressures >$1.3 \times 10^{-2}$ Pa ($1 \times 10^{-4}$ torr) at any time subsequent to the most recent conditioning sequence. If this cannot be confirmed, a conditioning must be performed per the preceding section 4.5, before an ignition may be attempted.

These procedures are to be conducted at pressures <$6.7 \times 10^{-4}$ Pa ($5 \times 10^{-6}$ torr) prior to gas flow, and at pressures of >$6.7 \times 10^{-4}$ Pa ($5 \times 10^{-6}$ torr) during gas flow, as long as this pressure rise is entirely a result of the gas flow.

4.6.2.1 HCA ignition sequence:

At t=0 seconds: Apply 8.5 DC Amperes, limited to 74.5 W, to the HCA heater.

At t=206 seconds: Open gas control valve to allow xenon flow.

At t=210 seconds: Energize the anode power supply to apply open circuit voltage and engage the ignition pulse generator.

Maintain the heater current until an anode current of 2.5 Amperes is detected. Ignition should occur prior to t=1800 seconds.

After 2.5 Amperes of anode current is detected, de-energize the heater power supply.

What is claimed is:

1. A process for ignition of a gaseous electrical discharge between cathode and anode electrodes of a HCA, using: 1) a source of xenon gas which is operatively connected to a gas control valve; 2) an ignition pulse generator with circuit requirements including an ignition pulse generator output with a magnitude of 750±100 Volts and a leading-edge rate-of-rise greater than 150 Volts DC, an ignition pulse duration of less than 20 microseconds, a frequency of 10 Hz, a pulse ignitor active on power up of the anode power supply to establish an anode current of 0.5 Amperes, and a charging stage of the ignition pulse generator disabled until the circuit current is extinguished; said ignition pulse generator automatically engaging upon involuntary discharge extinction; anode power supply stage requirements including nominal characteristics of +40 Volts DC at 3.0 Amperes DC current; and 3) a heater having power supply requirements including the heater power supply shall be energized until the anode current exceeds 2.5 Amperes DC, comprising the steps of:

a) confirming that the HCA has not been exposed to air at pressures >$1.3 \times 10^{-2}$ Pa ($1 \times 10^{-4}$ torr) at any time subsequent to the most recent conditioning sequence or, if this cannot be confirmed, performing a conditioning while maintaining a facility pressure of less than $6.7 \times 10^{-4}$ Pa. consisting of the following steps:

a1) Installing the HCA in a vacuum of less than $6.7 \times 10^{-4}$ Pa for at least 12 hours;

a2) Energizing the heater to 3.85 Amperes having a corresponding critical temperature of 550° C. for a minimum of 3 hours;

a3) De-energizing the heater for half an hour;

a4) Energizing the heater to 7.2 Amperes having a corresponding critical temperature of 550° C. for 1 hour;

a5) De-energizing the heater for a minimum of at least one-half hour;

b) pressurizing the HCA at pressures less than $6.7 \times 10^{-4}$ Pa ($5 \times 10^{-6}$ torr) prior to gas flow, and at pressures greater than $6.7 \times 10^{-4}$ Pa ($5 \times 10^{-6}$ torr) during gas flow;

c) applying 8.5 Amperes DC, limited to 74.5 Watts, to the HCA heater at t=0 seconds;

d) opening the gas control valve to allow xenon flow at t=206 seconds;

e) energizing the anode power supply to apply open circuit voltage and engage the ignition pulse generator at t=210 seconds;

f) maintaining the heater current until an anode current of 2.5 Amperes is detected, whereupon ignition should occur prior to t=1800 seconds;

g) detecting 2.5 Amperes of anode current; and, h) de-energizing the heater power supply.

* * * * *